United States Patent
Park et al.

(10) Patent No.: US 12,224,025 B2
(45) Date of Patent: *Feb. 11, 2025

(54) NON-VOLATILE MEMORY DEVICE INCLUDING SENSE AMPLIFIER AND METHOD FOR OPERATING THE SAME

(71) Applicant: SK keyfoundry Inc., Cheongju-si (KR)

(72) Inventors: Seong Jun Park, Suwon-si (KR); Sung Bum Park, Seongnam-si (KR); Kee Sik Ahn, Hwaseong-si (KR)

(73) Assignee: SK Keyfoundry Inc., Cheongju-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/502,580

(22) Filed: Nov. 6, 2023

(65) Prior Publication Data

US 2024/0071540 A1 Feb. 29, 2024

Related U.S. Application Data

(63) Continuation of application No. 17/741,635, filed on May 11, 2022, now Pat. No. 11,848,061.

(30) Foreign Application Priority Data

Jan. 27, 2022 (KR) .................. 10-2022-0012031

(51) Int. Cl.
*G11C 17/18* (2006.01)
*G11C 17/16* (2006.01)

(52) U.S. Cl.
CPC .............. *G11C 17/18* (2013.01); *G11C 17/16* (2013.01)

(58) Field of Classification Search
CPC ................................ G11C 17/18; G11C 17/16
(Continued)

(56) References Cited

U.S. PATENT DOCUMENTS 9,940,978 B2   4/2018 Boujmaa
9,991,002 B2   6/2018 Huang et al.
(Continued)

FOREIGN PATENT DOCUMENTS

JP   3886669 B2   2/2007
KR   940000149 B1 * 1/1994
(Continued)

OTHER PUBLICATIONS

Mukherjee, Sayak, et al. "A Study into Comparison of Voltage Sense Amplifier and Charge Transfer Sense Amplifier." International Journal of Emerging Technology and Advanced Engineering 10, Jun. 2020, (8 pages).

(Continued)

*Primary Examiner* — Huan Hoang
(74) *Attorney, Agent, or Firm* — NSIP Law

(57) ABSTRACT

Various embodiments of the present disclosure relate to a non-volatile memory device including a sense amplifier and an operation method thereof. The non-volatile memory device may include: a memory cell array comprising a plurality of memory cells; and the sense amplifier configured to read data of the plurality of memory cells and output the read data. The sense amplifier may include: a first stage sense amplifier configured to sense a voltage difference between a reference voltage and a voltage of a bit line connected to at least one memory cell among the plurality of memory cells, and perform a primary amplification of the sensed voltage difference; and a second stage sense amplifier configured to perform a secondary amplification of a first result of the primary amplification and output a second result of the secondary amplification.

19 Claims, 10 Drawing Sheets

(58) Field of Classification Search
USPC .......................................................... 365/96
See application file for complete search history.

(56) References Cited

U.S. PATENT DOCUMENTS

| | | |
|---|---|---|
| 10,796,735 B1 | 10/2020 | Lee et al. |
| 11,848,061 B2 * | 12/2023 | Park ..................... G11C 17/16 |
| 2012/0300566 A1 | 11/2012 | Mueller et al. |

FOREIGN PATENT DOCUMENTS

| | | | |
|---|---|---|---|
| KR | 10-2005-0096065 A | | 10/2005 |
| KR | 20050097065 A | * | 10/2005 |
| KR | 10-2008-0063896 A | | 7/2008 |
| KR | 10-2013-0090714 A | | 8/2013 |

OTHER PUBLICATIONS

Korean Office Action Issued on Feb. 21, 2023, in Counterpart Korean Patent Application No. 10-2022-0012031 (7 Pages in Korean).
Korean Office Action issued on Feb. 21, 2023, in counterpart Korean Patent Application No. 10-2022-0012031 (8 pages in English, 7 pages in Korean).
Korean Office Action issued on Aug. 9, 2023, in counterpart Korean Patent Application No. 10-2022-0012031 (7 pages in Korean).

* cited by examiner

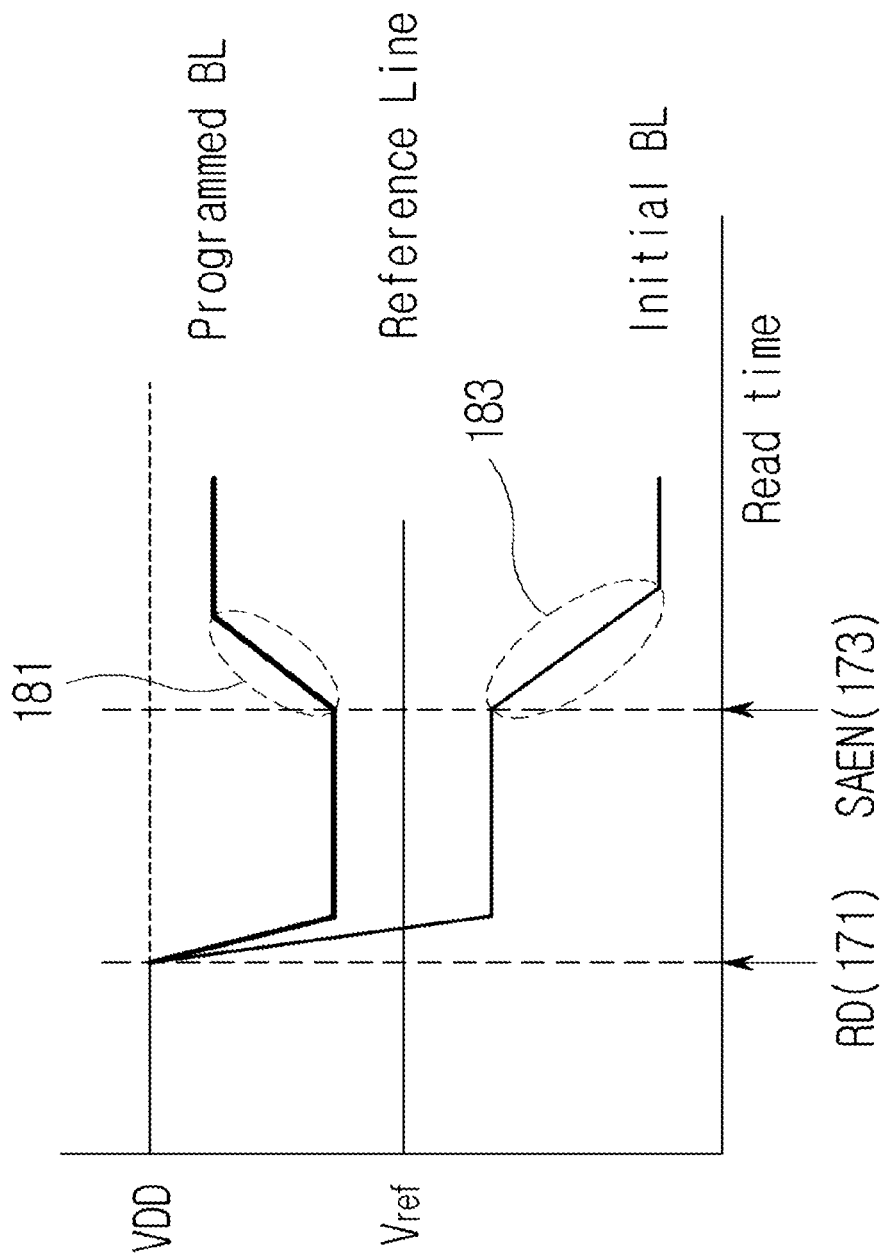

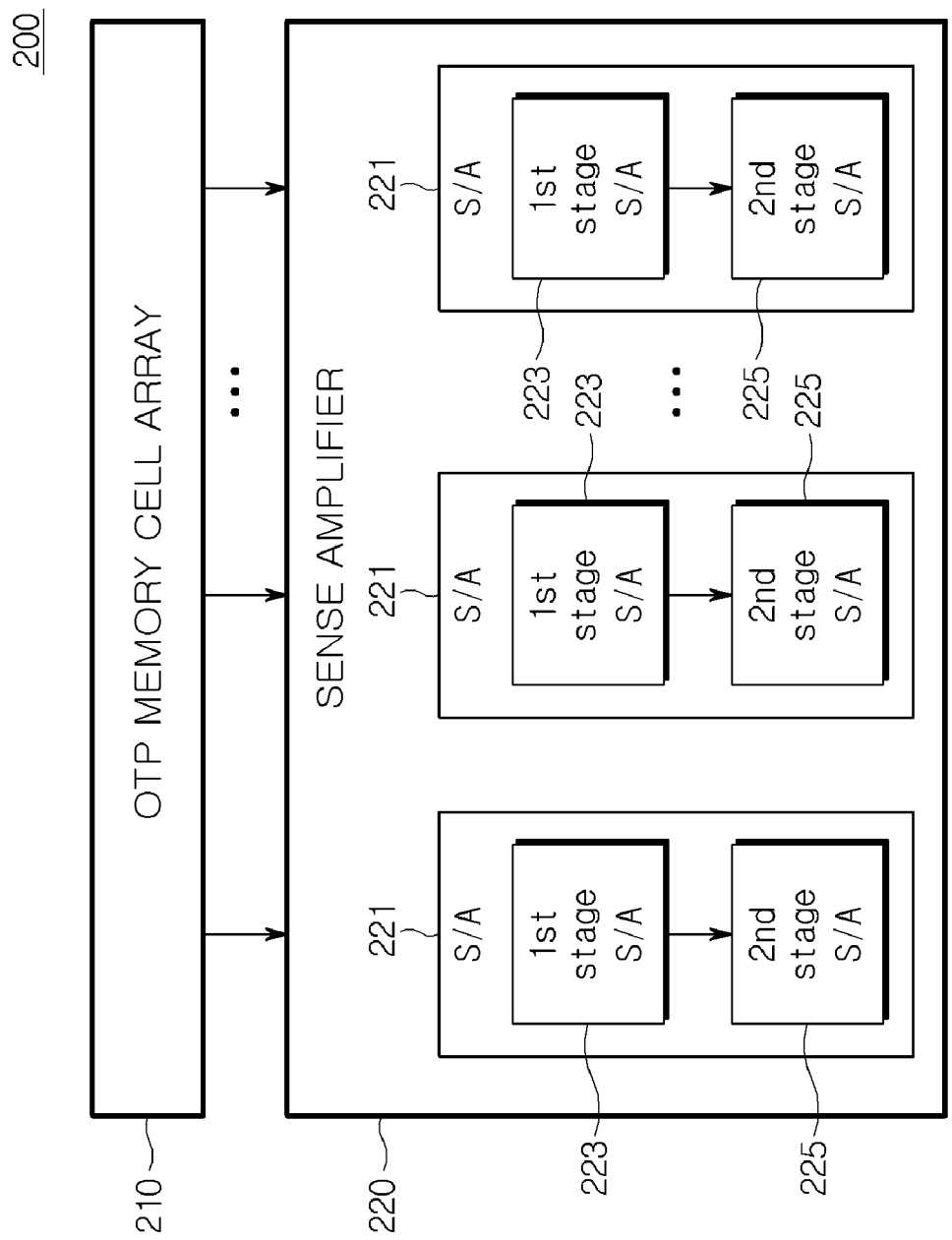

NON-VOLATILE MEMORY DEVICE INCLUDING SENSE AMPLIFIER AND METHOD FOR OPERATING THE SAME

CROSS-REFERENCE TO RELATED APPLICATIONS

This application is a continuation of U.S. patent application Ser. No. 17/741,635 filed on May 11, 2022, which claims the benefit under 35 U.S.C. § 119 of Korean Patent Application No. 10-2022-0012031, filed on Jan. 27, 2022, in the Korean Intellectual Property Office, the entire disclosure of which is incorporated herein by reference for all purposes.

BACKGROUND

1. Field

Various embodiments of the present disclosure relate to a non-volatile memory device including a sense amplifier and a method for operating the same.

2. Description of Related Art

A non-volatile memory (NVM) device includes a plurality of memory cells, and may output a read data stored in the memory cell array in response to a read command. For example, the NVM device uses a sense amplifier that senses voltage and/or current through a plurality of bit lines connected to the memory cell array, thereby producing the read data stored in the selected memory cell corresponding to a specified address.

Recently, some applications that operate in connection with an eFuse-type one-time programmable (OTP) non-volatile memory device have been proposed with an intent to read and use data stored in a memory cell array even at a low voltage. For example, the eFuse type OTP memory supplied with a power supply voltage of 5 V generally operates within a range of ±10% based on a voltage of 5 V.

Also, some applications have been proposed with an intent to read and use data stored in the memory cell array even at a voltage of 2 V, which is significantly lower than 5 V. Accordingly, the eFuse type OTP non-volatile memory device needs to perform an operation of reading data stored in the memory cell array even at a low voltage.

In an eFuse type one-time programmable non-volatile memory device, a sense amplifier may sense a difference between voltage inputs to both ends thereof, and may amplify and output the sensed voltage difference. However, since the difference between the voltage inputs to both ends of the sense amplifier is very small at a low voltage, a long time is required for the sense amplifier to sense and amplify the voltage difference. Accordingly, there is a problem that high-speed operations are impossible. In addition, in the eFuse type one-time programmable non-volatile memory device, the sense amplifier has a problem that it cannot amplify the difference in input voltage to a full logic level, due to DC current generated at an input and output terminals.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Accordingly, various embodiments of the present disclosure disclose a non-volatile memory device including a sense amplifier capable of high-speed operations even at a low voltage, and a method for operating the same.

Various embodiments of the present disclosure disclose the non-volatile memory device including the sense amplifier having a two-stage sensing structure, in which an input terminal and a final output terminal are separated, and a method of operating the same.

In one general aspect, the non-volatile memory device may include: a memory cell array including a plurality of memory cells; and a sense amplifier configured to read and output data of the plurality of memory cells. The sense amplifier may include: a first stage sense amplifier configured to sense a voltage difference between a reference voltage and a voltage of a bit line connected to at least one memory cell among the plurality of memory cells, and perform a primary amplification of the sensed voltage difference; and a second stage sense amplifier configured to perform a secondary amplification of a first result of the primary amplification and output a second result of the secondary amplification.

The first stage sense amplifier may include a first positive feedback circuit. The first positive feedback circuit may be connected to a first input terminal SA, to which the voltage of the bit line is applied, and to a second input terminal SAB, to which the reference voltage is applied, sense the voltage difference between the reference voltage and the voltage of the bit line, perform the primary amplification of the sensed voltage difference, and then output the first result of the primary amplification to the first input terminal SA and the second input terminal SAB. The first positive feedback circuit may be driven based on an SAENB signal that is an inverted signal of an SAEN signal for enabling the sense amplifier.

The first stage sense amplifier may further include a first PMOS transistor of the first stage sense amplifier PM1_1, of which both ends are connected to the first positive feedback circuit and a power supply voltage VDD. The first positive feedback circuit may be driven when the SAENB signal input to a gate of the first PMOS transistor of the first stage sense amplifier PM1_1 is at a low level.

The first stage sense amplifier may further include: a second PMOS transistor of the first stage sense amplifier PM2_1, of which both ends are connected to the first input terminal SA and the power supply voltage VDD; and a third PMOS transistor of the first stage sense amplifier PM3_1, of which both ends are connected to the second input terminal SAB and the power supply voltage VDD. The first input terminal SA and the second input terminal SAB may be charged by the power supply voltage VDD, while a read mode inversion signal RDN with a low level supplies to a gate of the second PMOS transistor of the first stage sense amplifier PM2_1 and a gate of the third PMOS transistor of the first stage sense amplifier PM3_1. The read mode inversion signal with the low level may indicate that a mode of the non-volatile memory device is not in a read mode.

The first stage sense amplifier may further include a first NMOS transistor of the first stage sense amplifier NM1_1, of which both ends are connected to the first positive feedback circuit and a ground voltage VSS. When the SAEN signal with a high level supplies to a gate of the first NMOS transistor of the first stage sense amplifier NM1_1, the first positive feedback circuit may be connected to the ground voltage VSS.

The first positive feedback circuit may include a fourth PMOS transistor of the first positive feedback circuit PM4_1, a fifth PMOS transistor of the first positive feedback circuit PM5_1, a second NMOS transistor of the first positive feedback circuit NM2_1, and a third NMOS transistor of the first positive feedback circuit NM3_1.

The second stage sense amplifier may include a second positive feedback circuit, which performs the secondary amplification, based on the first result of the primary amplification. The second positive feedback circuit may be driven based on an SAENDB signal that is a delayed signal of the SAENB signal.

The second stage sense amplifier may further include a first PMOS transistor of the second stage sense amplifier PM1_2, of which both ends are connected to the second positive feedback circuit and the power supply voltage VDD. The second positive feedback circuit may be driven when the SAENDB signal with a high level supplies to a gate of the first PMOS transistor of the second stage sense amplifier PM1_2.

The second stage sense amplifier may further include a third PMOS transistor of the second stage sense amplifier PM3_2 and a second PMOS transistor of the second stage sense amplifier PM2_2, which connects between the first PMOS transistor of the second stage sense amplifier PM1_2 and the second positive feedback circuit. A gate of the second PMOS transistor of the second stage sense amplifier PM2_2 may be connected to the first input terminal SA of the first stage sense amplifier. A gate of the third PMOS transistor of the second stage sense amplifier PM3_2 may be connected to the second input terminal SAB of the first stage sense amplifier.

The second positive feedback circuit may be connected to a first output terminal SAO and a second output terminal SAOB, which output the second result of the secondary amplification. The first output terminal SAO and the second output terminal SAOB may be separated from the first input terminal SA and the second input terminal SAB.

The second positive feedback circuit may further include: a first NMOS transistor of the second positive feedback circuit NM1_2, of which both ends are connected to the second output terminal SAOB and the ground voltage VSS; and a second NMOS transistor of the second positive feedback circuit NM2_2, of which both ends are connected to the first output terminal SAO and the ground voltage VSS. When the SAENDB signal is input to gates of the first NMOS transistor of the second positive feedback circuit NM1_2 and the second NMOS transistor of the second positive feedback circuit NM2_2 is at a high level, the second positive feedback circuit may be connected to the ground voltage VSS.

The second positive feedback circuit may include a fourth PMOS transistor of the second positive feedback circuit PM4_2, a fifth PMOS transistor of the second positive feedback circuit PM5_2, a third NMOS transistor of the second positive feedback circuit NM3_2, and a fourth NMOS transistor of the second positive feedback circuit NM4_2.

Each of the plurality of memory cells may include a first NMOS transistor of the plurality of memory cells NM_11 and an eFuse eF_R_11. The eFuse eF_R_11 may be programmed when the first NMOS transistor of the plurality of memory cells NM_11 is turned on, and may not be programmed when the first NMOS transistor of the plurality of memory cells NM_11 is turned off.

The first input terminal SA may be connected to the bit line connected to at least one memory cell among the plurality of memory cells. A first reference resistance element R1-1 and a first reference PMOS transistor P1-1 may be connected to the first bit line BL-1 between the at least one memory cell and the first input terminal SA.

A gate of a first reference NMOS transistor N1-1 may be connected to a read mode inversion signal RDN line, and both ends of the first reference NMOS transistor N1-1 may be connected to ground and the eFuse eF_R_11.

The non-volatile memory device may further include, in order to generate the reference voltage, a second reference PMOS transistor P2-1, a second reference resistance element R2-1, a second reference NMOS transistor N2-1, a third reference resistance element R3-1, and a third reference NMOS transistor N3-1, which are sequentially connected in series between the power supply voltage VDD and a first reference voltage. The second input terminal SAB may be supplied with the reference voltage through a reference line RL, which is connected between the second reference resistance element R2-1 and the second reference NMOS transistor N2-1.

In another general aspect, the method for operating a sense amplifier in a non-volatile memory device includes: performing, by a first stage sense amplifier of the sense amplifier, a primary amplification based on a voltage difference between a reference voltage and a voltage of a bit line connected to at least one memory cell in a read mode; and performing, by a second stage sense amplifier of the sense amplifier, a secondary amplification of a result of the primary amplification.

When an SAENB signal, that is an inverted signal of an SAEN signal for enabling the sense amplifier, is at a low level, the primary amplification may be performed through a first positive feedback circuit included in the first stage sense amplifier.

When an SAENDB signal, that is a delayed signal of the SAENB signal, is at a low level, the secondary amplification of the result of the primary amplification may be performed through a second positive feedback circuit included in the second stage sense amplifier.

Other features and aspects will be apparent from the following detailed description, the drawings, and the claims.

BRIEF DESCRIPTION OF THE DRAWINGS

FIG. 1C illustrates a read operation of the sense amplifier of FIG. 1A according to various embodiments of the present disclosure.

FIG. 2 illustrates a block diagram of a non-volatile memory device according to various embodiments of the present disclosure.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1A:
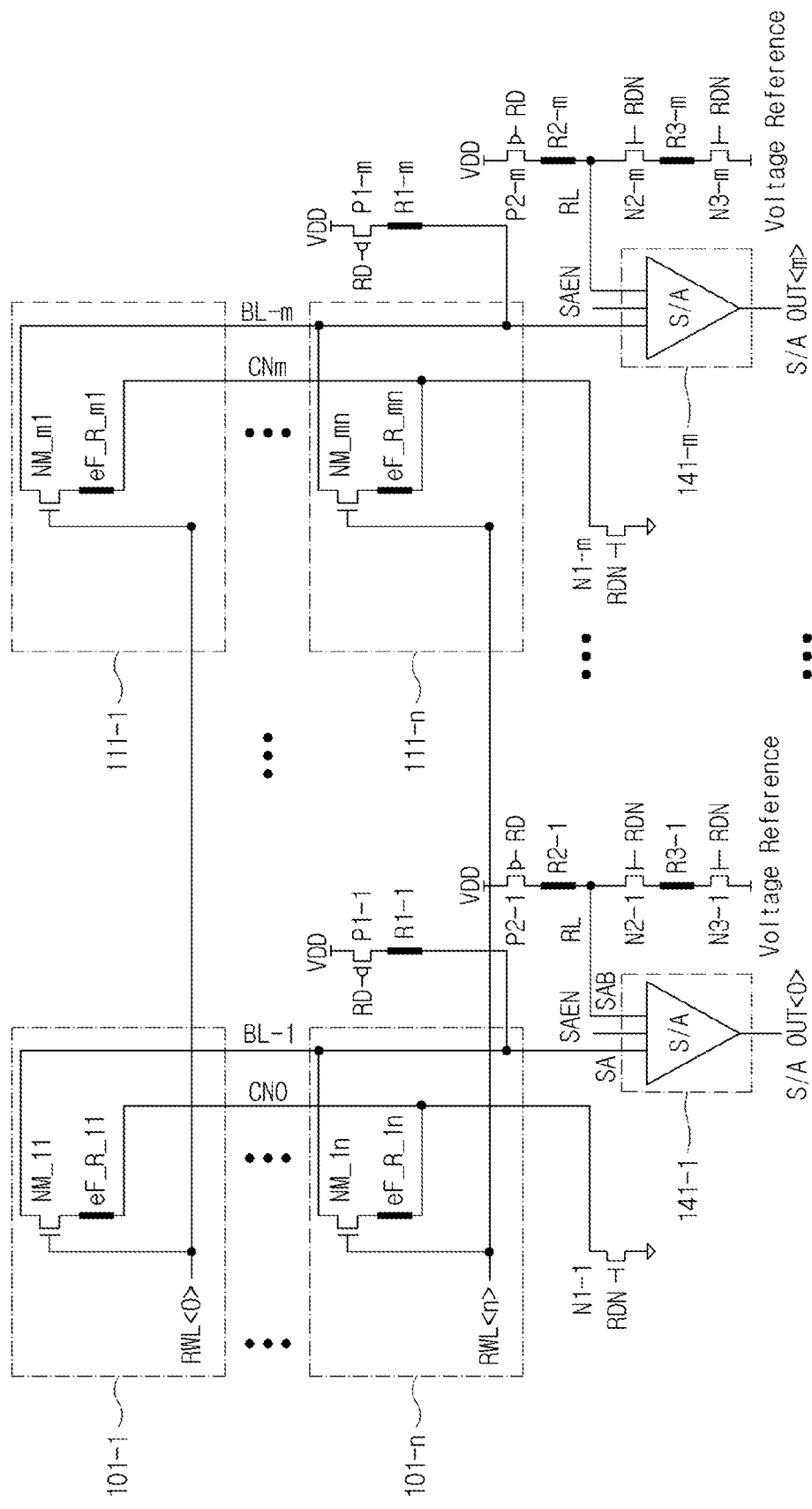
FIG. 1A illustrates a circuit structure of a non-volatile memory device according to various embodiments of the present disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

What one component is referred to as being "connected to" or "coupled to" another component includes both a case where one component is directly connected or coupled to another component and a case where a further another component is interposed between them. Meanwhile, what one component is referred to as being "directly connected to" or "directly coupled to" another component indicates that a further another component is not interposed between them. The term "and/or" includes each of the mentioned items and one or more all of combinations thereof.

Terms used in the present disclosure are provided for description of only specific embodiments of the present disclosure, and not intended to be limiting. In the present disclosure, an expression of a singular form includes the expression of plural form thereof, if not specifically stated. The terms "includes" and/or "including" used in the disclosure is intended to specify characteristics, numbers, steps, operations, components, parts or any combination thereof, which are mentioned in the disclosure, and intended not to exclude the existence or addition of at least one another characteristics, numbers, steps, operations, components, parts or any combination thereof.

While terms such as the first and the second, etc., can be used to describe various components, the components are not limited by the terms mentioned above. The terms are used only for distinguishing between one component and other components.

Therefore, the first component to be described below may be the second component within the spirit of the present disclosure. Unless differently defined, all terms used herein including technical and scientific terms have the same meaning as commonly understood by one of ordinary skill in the art to which the present disclosure belongs. Also, commonly used terms defined in the dictionary should not be ideally or excessively construed as long as the terms are not clearly and specifically defined in the present disclosure.

A term "module" or "unit" used in the embodiments of the present disclosure means a hardware component such as software or a field programmable gate array (FPGA) or an application specific integrated circuit (ASIC), and the "unit" or "module" performs certain roles. However, "unit" or "module" is not limited to software or hardware. The "unit" or "module" may be configured to be positioned in an addressable storage medium or may be configured to regenerate one or more processors. Thus, as an example, the "unit" or "module" may include components such as software components, object-oriented software components, class components, and task components, processes, functions, properties, procedures, subroutines, segments of program code, drivers, firmware, microcode, circuitry, data, databases, data structures, tables, arrays, and variables. Functions provided within components and "unit" or "modules" may be separated into smaller numbers of components and "units" or "modules" or integrated into additional components and "unit" or "modules".

Methods or algorithm steps described relative to some embodiments of the present disclosure may be directly implemented by hardware and software modules that are executed by a processor or may be directly implemented by a combination thereof. The software module reside on a RAM, a flash memory, a ROM, an EPROM, an EEPROM, a resistor, a hard disk, a removable disk, a CD-ROM, or any other type of record medium known to those skilled in the art. An exemplary record medium is coupled to a processor and the processor can read information from the record medium and can record the information in a storage medium. In another way, the record medium may be integrally formed with the processor. The processor and the record medium may reside within an application specific integrated circuit (ASIC). The ASIC may reside within a user's terminal.

Hereinafter, in the present disclosure, a non-volatile memory device will be described by taking an example of an eFuse (electrical fuse) type one-time programmable (OTP) memory. However, the following embodiments of the present disclosure are not limited to the OTP memory. For example, the following embodiments of the present disclosure can be applied to all non-volatile memory devices that use a sense amplifier (S/A) to read data.

Figure 1B:
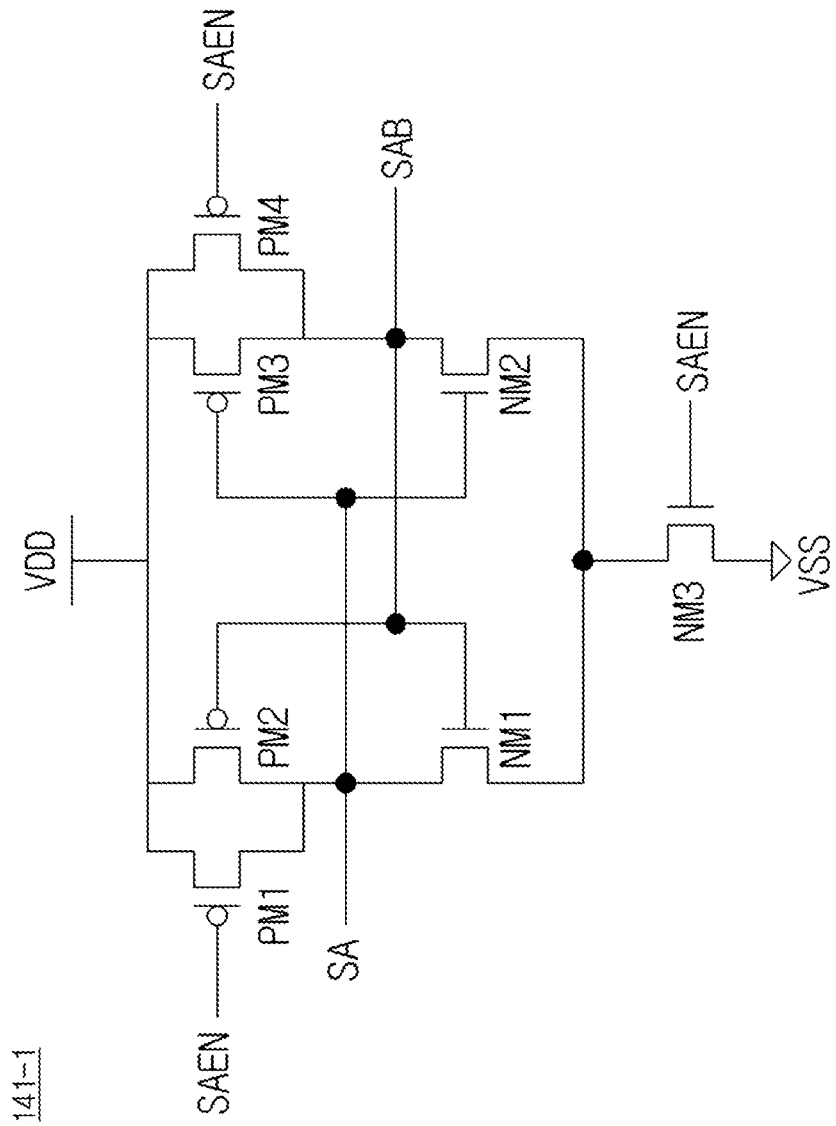
FIG. 1B illustrates a circuit structure of a sense amplifier included in the non-volatile memory device of FIG. 1A according to various embodiments of the present disclosure.

FIG. 1A illustrates a circuit structure of a non-volatile memory device 100 according to various embodiments of the present disclosure. FIG. 1B illustrates a circuit structure of a sense amplifier included in the non-volatile memory device 100 of FIG. 1A according to various embodiments of the present disclosure.

FIG. 1A illustrates only some components required for a read operation of the sense amplifier among components included in the non-volatile memory device 100. The non-volatile memory device 100 may include other components.

Referring to FIG. 1A, the non-volatile memory device 100 may include a memory cell array including a plurality of memory cells 101-1, . . . , 101-$n$, 111-1, . . . , and 111-$n$, and a plurality of sense amplifiers 141-1, . . . , and 141-$m$. The memory cells 101-1, . . . , and 101-$n$ are connected to the first bit line BL-1.

According to various embodiments, the plurality of memory cells 101-1, . . . , 101-$n$, 111-1, . . . , and 111-$n$ included in the memory cell array may be respectively located at points, where a plurality of read word lines RWL<0>, RWL<n> and a plurality of bit lines BL-1, . . . , BL-m intersect. Each of the plurality of memory cells 101-1, . . . , 101-$n$, 111-1, . . . , and 111-$n$ has the same structure and operates in the same manner, and the plurality of sense amplifiers 141-1, . . . , and 141-$m$ are configured in the same manner for each bit line and operate in the same manner. Therefore, in the present disclosure, one bit line (e.g., a first bit line) will be described as an example. However, the following description can be applied in the same manner to all bit lines.

The memory cells 101-1, . . . , and 101-n may include first NMOS transistors NM_11, . . . , and NM_1n and first eFuses eF_R_11, . . . , and eF_R_1n, respectively. The gates of the first NMOS transistors NM_11, . . . , and NM_1n may be connected to read word lines RWL, and both ends of the first NMOS transistors NM_11, . . . , and NM_1n may be connected to the first eFuses eF_R_11, . . . , and eF_R_1n and the sense amplifier 141-1. The both ends refer to source/drain. The first eFuses eF_R_11, . . . , and eF_R_1n may be connected between the first NMOS transistors NM_11, . . . , and NM_1n and a first reference NMOS transistor N1-1.

The gate of the first reference NMOS transistor N1-1 may be connected to an RDN line, and both ends of the first reference NMOS transistor N1-1 may be connected to ground and the first eFuses eF_R_11, . . . , and eF_R_1n. Here, for each column, CN0, . . . , and CNm corresponding to a common node (CN for short) are present. For example, the unit cells 101-1, . . . , and 101-n arranged in a first column are connected to the first one common node CN0. Also, the first common node CN0 is connected to the first reference NMOS transistor N1-1. As a result, many unit memory cells are connected to the first reference NMOS transistor N1-1 by using the first one common node CN0. That is, the first reference NMOS transistor N1-1 is not provided to each unit cell. Therefore, the cross-sectional area of the memory cell array can be significantly reduced.

The RDN line may be provided with an RDN signal, which is an inverted signal of an RD signal indicating whether a mode of the non-volatile memory device is a read mode for a read operation. For example, in the read mode for the read operation, a high-level signal is provided to the RDN line, and when not in the read mode, a low-level signal is provided to the RDN line.

The first eFuses eF_R_11, . . . , and eF_R_1n included in the memory cells 101-1, . . . , and 101-n, respectively, may be blown or maintained depending on a voltage applied by the first NMOS transistors NM_11, . . . , and NM_1n. For example, during the performance of a write operation to a specified address, the first eFuse eF_R_11 of the first memory cell 101-1 connected to the first bit line BL-1 is blown by a high voltage applied by turning on the first NMOS transistor NM_11, thereby being programmed. For another example, during the performance of the write operation to a specified address, the first eFuse eF_R_1n of the n-th memory cell 101-n connected to the first bit line BL-1 may maintain an initial state by the n-th first NMOS transistor NM_1n, which maintains a turn-off state.

A first input terminal SA of the sense amplifier 141-1 may be connected to the first bit line BL-1, and a second input terminal SAB may be connected to a reference line RL. The sense amplifier 141-1 may be driven based on an SAEN signal for enabling the sense amplifier. When the high-level SAEN signal is input, the sense amplifier 141-1 may sense a voltage difference between the first input terminal SA and the second input terminal SAB and may amplify the sensed voltage difference, thereby reading data programmed into the memory cell corresponding to a specified address.

According to the embodiment, a first reference resistance element R1-1 and a first reference PMOS transistor P1-1 may be connected to the first bit line BL-1. A gate of the first reference PMOS transistor P1-1 may be connected to an RD signal line, and both ends of the first reference PMOS transistor P1-1 may be connected to a power supply voltage VDD and the first reference resistance element R1-1, respectively. The RD signal line may be provided with the RD signal indicating whether the mode of the non-volatile memory device is the read mode. For example, in the read mode, a low-level signal may be provided to the RD signal line, and when not in the read mode, a high-level signal may be provided to the RD signal line.

When the read mode is performed, the first reference NMOS transistor N1-1 and the first reference PMOS transistor P1-1 may be turned on (ON), and one NMOS transistor to be read among the first NMOS transistors NM_11, . . . , and NM_1n may be turned on (ON) by a read word line RWL signal. A voltage determined by the first eFuses eF_R_11, . . . , and eF_R_1n may be applied to the first input terminal SA of the sense amplifier 141-1. For example, the voltage applied to the first input terminal SA may vary depending on whether the first eFuse selected by the read word line RWL is programmed to have a programmed resistance value (programmed R) or is not programmed and thus has a resistance value in the initial state (initial R).

According to the embodiment, in order to generate a reference voltage Vref, which is applied to the second input terminal SAB of the sense amplifier 141-1, a second reference PMOS transistor P2-1, a second reference resistance element R2-1, a second reference NMOS transistor N2-1, a third reference resistance element R3-1, and a third reference NMOS transistor N3-1 may be sequentially connected in series between the power supply voltage VDD and a first reference voltage (Voltage Reference, e.g., 0 V). In addition, the reference line RL connected to the second input terminal SAB of the sense amplifier 141-1 may be connected between the second reference resistance element R2-1 and the second reference NMOS transistor N2-1.

A gate of the second reference PMOS transistor P2-1 may be connected to the RD signal line, and gates of the second reference NMOS transistor N2-1 and the third reference NMOS transistor N3-1 may be connected to an RDN signal line.

When the read mode is performed, a low-level signal may be provided to the RD signal line and a high-level signal may be provided to the RDN signal line. Then, the low-level RD signal is provided to the gate of the second reference PMOS transistor P2-1, and the high-level RDN signal is provided to the gates of the second reference NMOS transistor N2-1 and the third reference NMOS transistor N3-1, such that the second reference PMOS transistor P2-1, the second reference NMOS transistor N2-1, and the third reference NMOS transistor N3-1 are all turned on (ON). Then, the reference voltage Vref applied to the second input terminal SAB may be a half of a sum of the power supply voltage VDD and the first reference voltage (Voltage Reference). According to the embodiment, the first reference voltage provided from a reference voltage generator may be 0 V. Accordingly, the voltage applied to the second input terminal SAB may have a voltage value (half VDD) corresponding to a half of the power supply voltage, by the power supply voltage VDD and the first reference voltage of 0 V. Hereinafter, the voltage applied to the second input terminal SAB, that is, the voltage value (half VDD) corresponding to a half of the power supply voltage may be referred to as a reference voltage, Vref.

According to various embodiments, the sense amplifier 141-1 may include, as illustrated in FIG. 1B, four PMOS transistors PM1, PM2, PM3, and PM4, and three NMOS transistors NM1, NM2, and NM3.

In the sense amplifier 141-1, a connection structure of the four PMOS transistors PM1, PM2, PM3, and PM4 and the three NMOS transistors NM1, NM2, and NM3 will be described as follows.

A gate of the first PMOS transistor PM1 of the sense amplifier 141-1 may be connected to an SAEN signal line, to which the SAEN signal is input, and both ends of the first PMOS transistor PM1 may be connected to the power supply voltage VDD and the first input terminal SA. A gate of the second PMOS transistor PM2 of the sense amplifier 141-1 may be connected to the second input terminal SAB, and both ends of the second PMOS transistor PM2 may be connected to the power supply voltage VDD and the first input terminal SA. A gate of the third PMOS transistor PM3 of the sense amplifier 141-1 may be connected to the first input terminal SA, and both ends of the third PMOS transistor PM3 may be connected to the power supply voltage VDD and the second input terminal SAB. A gate of the fourth PMOS transistor PM4 of the sense amplifier 141-1 may be connected to the SAEN signal line, and both ends of the fourth PMOS transistor PM4 may be connected to the power supply voltage VDD and the second input terminal SAB.

A gate of the first NMOS transistor NM1 of the sense amplifier 141-1 may be connected to the second input terminal SAB, and both ends of the first NMOS transistor NM1 may be connected to the first input terminal SA and the third NMOS transistor NM3. A gate of the second NMOS transistor NM2 of the sense amplifier 141-1 may be connected to the first input terminal SA, and both ends of the second NMOS transistor NM2 may be connected to the second input terminal SAB and the third NMOS transistor NM3. A gate of the third NMOS transistor NM3 of the sense amplifier 141-1 is connected to the SAEN signal line, and both ends of the third NMOS transistor NM3 may be connected to a node between the first NMOS transistor NM1 and the second NMOS transistor NM2, and the ground voltage VSS.

The sense amplifier 141-1 configured as described above is supplied with a voltage generated by the resistance of a specific memory cell through the first input terminal SA, when a low signal for the operation of the sense amplifier is applied through the SAEN signal line. After receiving the reference voltage Vref through the second input terminal SAB, the sense amplifier may amplify and output a difference between the two voltages applied through the first input terminal SA and the second input terminal SAB.

However, as illustrated in FIG. 1B, the sense amplifier 141-1 has a structure, in which the first input terminal SA and the second input terminal SAB are both input and output terminals, so that the output terminal is affected by a DC current. For example, during the read operation of the non-volatile memory device 100, the transistors connected to the bit line BL-1 and the reference line RL, which are connected to the first input terminal SA and the second input terminal SAB of the sense amplifier 141-1 may be all turned on. Due to this, a DC current path to the first input terminal SA and the second input terminal SAB of the sense amplifier 141-1 is created, and thus, the amplifier 141-1 is not able to perform sensing through stable positive feedback. Accordingly, the voltage difference between the first input terminal SA and the second input terminal SAB of the sense amplifier 141-1 cannot be amplified to a full logic level.

FIG. 1C illustrates a read result of the sense amplifier 141-1 of FIG. 1A according to various embodiments of the present disclosure. Here, a case will be described as an example, where the first memory cell 101-1 among the memory cells 101-1, ..., and 101-n connected to the first bit line BL-1 is programmed and the n-th memory cell 101-n maintains the initial state.

First, a case where the sense amplifier 141-1 reads data of the programmed first memory cell 101-1 will be described as an example. Referring to FIG. 1C, after the RD signal 171 for the read operation is generated, the sense amplifier 141-1 may sense the voltage of the first bit line BL-1 through the first input terminal SA and may sense the reference voltage Vref through the second input terminal SAB. Here, since the first memory cell 101-1 has been programmed, the voltage of the first input terminal SA may be higher than the reference voltage Vref and less than the VDD.

When the high-level SAEN signal 173 is input to the sense amplifier 141-1, the sense amplifier 141-1 may amplify (see reference numeral 181) a difference between the reference voltage and the voltage generated by the programmed resistance of the first memory cell. However, as described above, since the voltage difference between the first input terminal SA and the second input terminal SAB is small and the DC current path is created, the amplified voltage of the sense amplifier 141-1 cannot reach the VDD that is a full logic level.

Next, a case where the sense amplifier 141-1 reads data from the n-th memory cell 101-n, which maintains the initial state without being programmed, will be described as an example.

Referring to FIG. 1C, after the RD signal 171 for the read operation is generated, the sense amplifier 141-1 may sense the voltage of the first bit line BL-1 through the first input terminal SA and may sense the reference voltage Vref through the second input terminal SAB. Here, since the n-th memory cell 101-n maintains the initial state, the voltage of the first input terminal SA may be greater than 0 and less than the reference voltage Vref. When the high-level SAEN signal 173 is input, the sense amplifier 141-1 may amplify (see reference numeral 183) a difference between the voltage generated by the resistance of the n-th memory cell 101-n in the initial state and the reference voltage Vref. However, as described above, since the voltage difference between the first input terminal SA and the second input terminal SAB is small and the DC current path is created, the amplified voltage of the sense amplifier 141-1 cannot reach 0 that is a full logic level.

Accordingly, various embodiments of the present disclosure disclose a non-volatile memory device including a sense amplifier capable of high-speed operations even at a low voltage through a two-stage sensing structure, in which an input terminal and a final output terminal are separated, and a method for operating the same.

FIG. 2 is a block diagram of a non-volatile memory device 200 according to various embodiments of the present disclosure.

Referring to FIG. 2, the non-volatile memory device 200 may include an OTP memory cell array 210 and a sense amplifier 220.

According to various embodiments of the present disclosure, the OPT memory cell array 210 may include a plurality of memory cells, and data may be written to a memory cell corresponding to a specified address. The plurality of memory cells may be respectively located at points, where a plurality of read word lines RWL<0>, ..., RWL<n> and a plurality of bit lines BL-1, ..., BL-m intersect.

According to various embodiments, the sense amplifier 220 may include a plurality of sense amplifiers 221, and thus, can read and output the data written to the OPT memory cell array 210. According to the embodiment, the sense amplifiers 221 may be connected to the plurality of bit lines connected to the OPT memory cell array 210, respectively, such that the sense amplifiers may read and output the data of the memory cells connected to the corresponding bit line.

According to the embodiments, each of the plurality of sense amplifiers 221 may include a first stage S/A 223 and a second stage S/A 225. Each of the plurality of sense amplifiers 221 includes the first stage S/A 223 and the second stage S/A 225, thereby performing two-stage amplification of a difference in input voltage. For example, the first stage may be a preliminary amplification stage of the difference in input voltage, and the second stage may be a regeneration amplification stage for amplifying the preliminarily amplified voltage difference to a full logic level.

According to the embodiment, in the first stage S/A 223, pre-sensing or the preliminary amplification may be performed to slightly amplify the difference between the voltage by a specific memory cell connected to the corresponding bit line and the reference voltage Vref.

According to the embodiment, in the second stage S/A 225, the preliminarily amplified voltage difference in the first stage S/A 223 is amplified again, such that the resulting value can be a full logic level.

Figure 3:
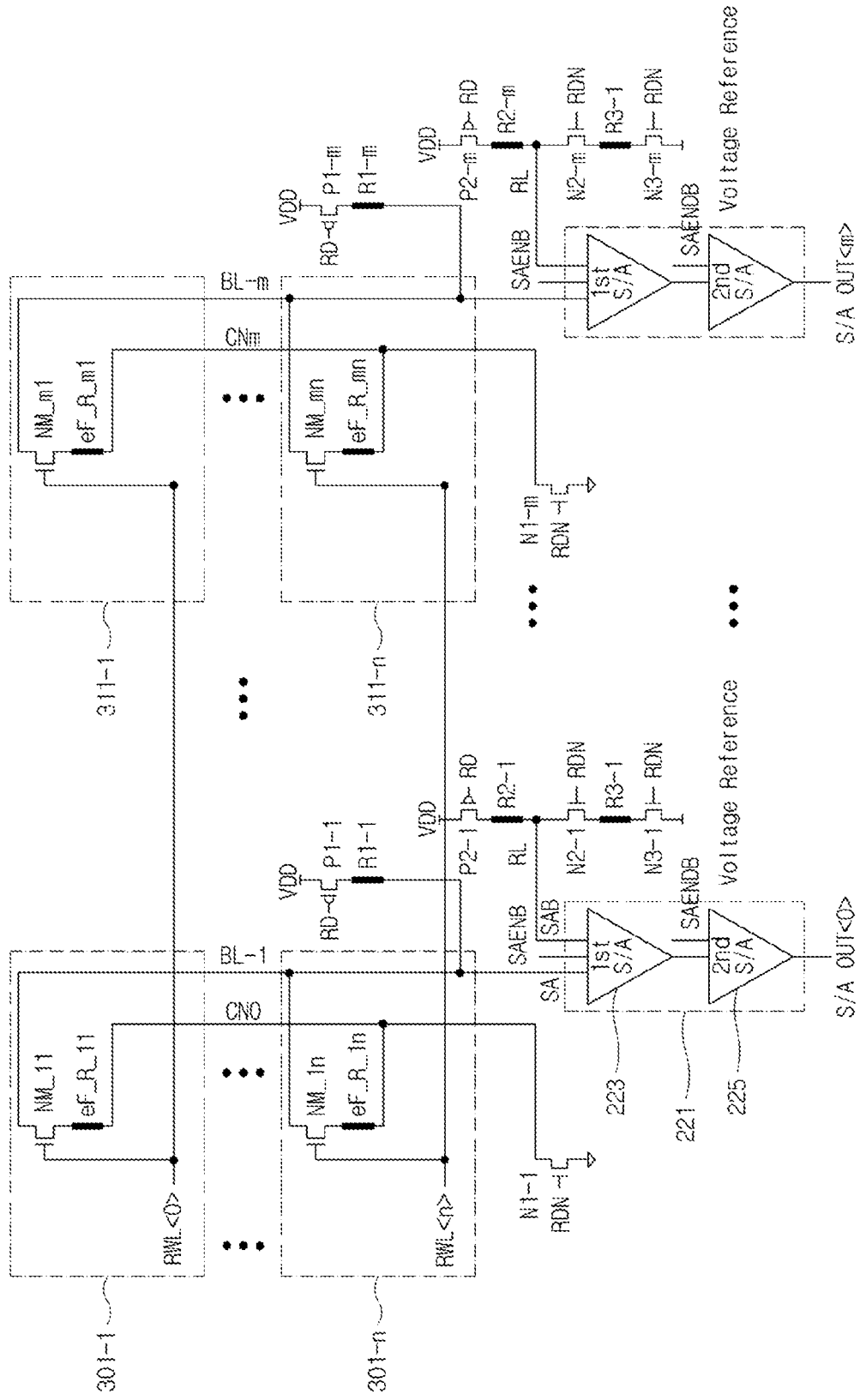
FIG. 3 illustrates the circuit structure of the non-volatile memory device according to various embodiments of the present disclosure.
Figure 4:
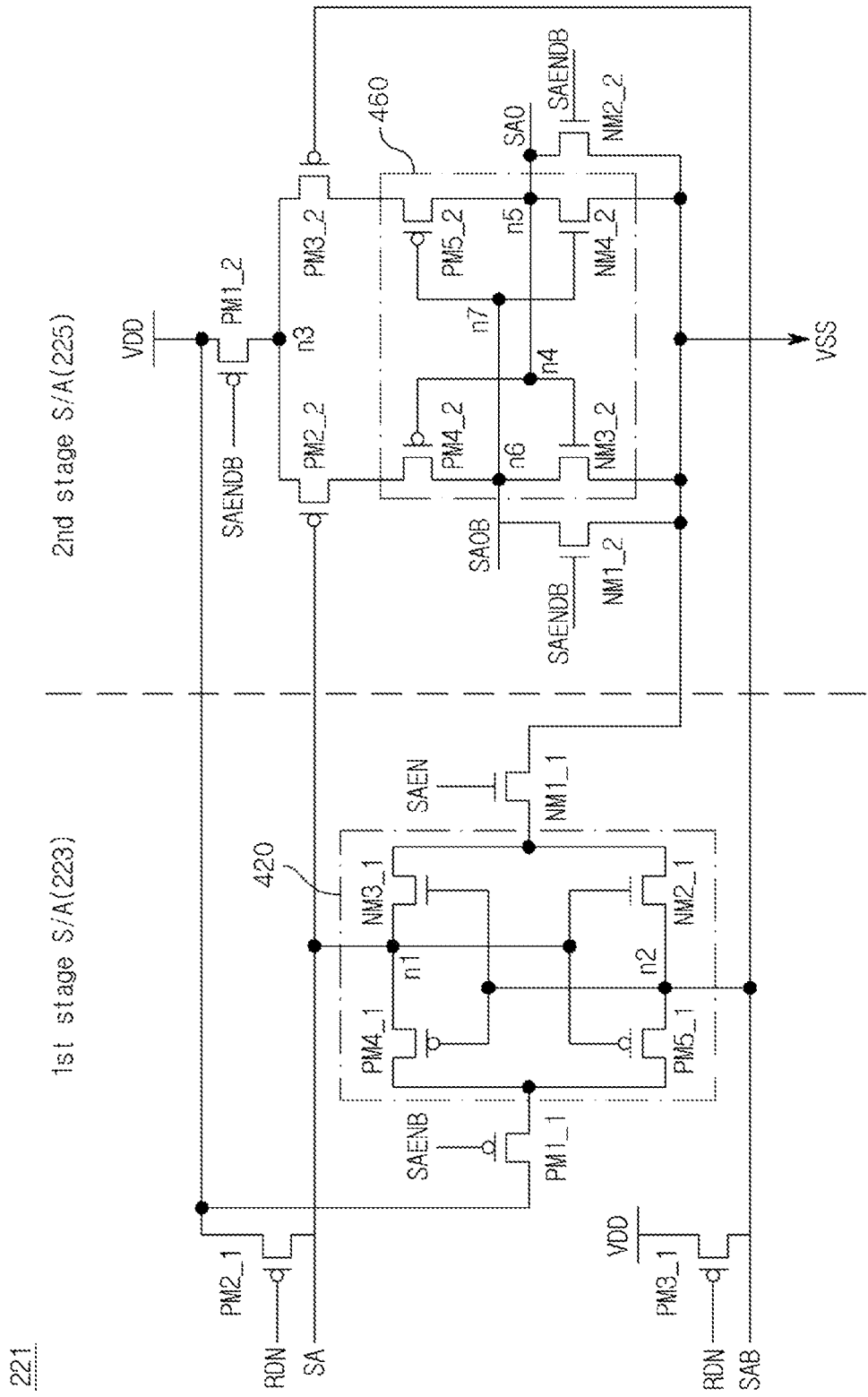
FIG. 4 illustrates the circuit structure of the sense amplifier according to various embodiments of the present disclosure.

FIG. 3 illustrates the circuit structure of a non-volatile memory device 200 according to various embodiments of the present disclosure. The circuit structure of the non-volatile memory device 200 of FIG. 3 illustrates in detail the circuit structure of the non-volatile memory device 200 of FIG. 2. In the following description, some configurations of FIG. 3 will be described with reference to FIG. 4. FIG. 4 illustrates the circuit structure of the sense amplifier according to various embodiments of the present disclosure.

According to various embodiments of the present disclosure, each of a plurality of memory cells 301-1, . . . , and 301-n, 311-1, . . . , and 311-n included in the OTP memory cell array 210 has the same structure, so that they operate in the same manner. Also, according to various embodiments of the present disclosure, a plurality of sense amplifiers 223 and 225 is configured in the same manner for each bit line and operate in the same manner. Therefore, in present disclosure, the sense amplifier and memory cells connected to one bit line (e.g., the first bit line BL-1) will be described as an example. However, the following description can be applied in the same manner to all bit lines.

Referring to FIG. 3, the memory cells 301-1, . . . , and 301-n may include the first NMOS transistors NM_11, . . . , and NM_1n, respectively. The gates of the first NMOS transistors NM_11, . . . , and NM_1n may be connected to read word lines RWL, and both ends of the first NMOS transistors NM_11, . . . , and NM_1n may be connected to the first eFuses eF_R_11, . . . , and eF_R_1n and a sense amplifier 221. The first eFuses eF_R_11, . . . , and eF_R_1n may be connected between the first NMOS transistors NM_11, . . . , and NM_1n and the first reference NMOS transistor N1-1.

According to the embodiment, for each column, CN0, . . . , and CNm corresponding to a common node (CN for short) are present. For example, the unit cells 101-1, . . . , and 101-n arranged in a first column are connected to the first one common node CN0. Also, the first common node CN0 is connected to the first reference NMOS transistor N1-1. As a result, many unit memory cells are connected to the first reference NMOS transistor N1-1 by using the first one common node CN0. That is, the first reference NMOS transistor N1-1 is not provided to each unit cell. Therefore, the cross-sectional area of the memory cell array can be significantly reduced.

According to the embodiment, the gate of the first reference NMOS transistor N1-1 may be connected to an RDN line, and both ends of the first reference NMOS transistor N1-1 may be connected to ground and the first eFuses eF_R_11, . . . , and eF_R_1n. The memory cells 101-1, . . . , and 101-n are connected to the first bit line BL-1. The RDN signal line may be provided with the RDN signal, which is an inverted signal of the RD signal. The RD signal may indicate whether the mode of the non-volatile memory device is the read mode for the read operation. For example, in the read mode for the read operation, the RD signal may be at a low level and the RDN signal may be at a high level. In this case, the first bit line BL-1 is connected to the sense amplifier 221 and a voltage level is transmitted. For another example, when not in the read mode, the RD signal may be at a high level and the RDN signal may be at a low level.

According to the embodiment, the first eFuses eF_R_11, . . . , and eF_R_1n included in the memory cells 301-1, . . . , and 301-n, respectively, may be blown or maintained depending on a voltage applied by the first NMOS transistors NM_11, . . . , and NM_1n. For example, during the performance of a write operation to a specified address, the first eFuse eF_R_11 of the first memory cell 301-1 connected to the first bit line BL-1 is blown by a high voltage applied by turning on the first NMOS transistor NM_11, thereby being programmed. For another example, during the performance of the write operation to a specified address, the first eFuse eF_R_1n of the n-th memory cell 301-n connected to the first bit line BL-1 may maintain an initial state by the n-th first NMOS transistor NM_1n, which maintains a turn-off state.

According to the embodiment, the first input terminal SA of the first stage S/A 223 of the sense amplifier 221 may be connected to the first bit line BL-1, and the second input terminal SAB may be connected to the reference line RL. The first stage S/A 223 may be driven based on an SAENB signal that is an inverted signal of the SAEN signal. The SAEN signal may be an enabling signal for the sense amplifier. For example, when the SAEN signal, that is the enabling signal for the sense amplifier, is at a high level, the SAENB signal may be at a low level. According to the embodiment, when the low-level SAENB signal is input, the first stage S/A 223 may sense the voltage difference between the first input terminal SA and the second input terminal SAB, may amplify the sensed voltage difference, and may provide a result of the amplification to the second stage S/A 225.

According to the embodiment, input terminals of the second stage S/A 225 of the sense amplifier 221 may be connected to the input terminals SA and SAB of the first stage S/A 223. The second stage S/A 225 may be driven based on an SAENDB signal. The SAENDB signal may have the same phase as that of the SAENB signal and may be a delayed signal. For example, when the low-level SAENDB signal is input, the second stage S/A 225 may sense a difference in voltage amplified by the preliminary amplification of the first stage S/A 223, and may amplify the sensed voltage difference to a full logic level.

According to the embodiment, the first reference resistance element R1-1 and the first reference PMOS transistor P1-1 may be connected to the first bit line BL-1 between the memory cells 301-1, . . . , and 301-n and the sense amplifier 221. The gate of the first reference PMOS transistor P1-1 may be connected to the RD signal line, and both ends of the first reference PMOS transistor P1-1 may be connected to the power supply voltage VDD and the first reference resistance element R1-1, respectively. The RD signal line may be provided with the RD signal indicating whether the mode of the non-volatile memory device is the read mode. For example, in the read mode, a low-level signal may be provided to the RD signal line, and when not in the read mode, a high-level signal may be provided to the RD signal line.

When the read mode is performed, the first reference NMOS transistor N1-1 and the first reference PMOS transistor P1-1 may be turned on (ON), and one NMOS transistor to be read among the first NMOS transistors NM_11, ..., and NM_1n may be turned on (ON) by the read word line RWL signal. Then, the first reference resistance element R1-1 between the power supply voltage VDD and the ground voltage VSS may be connected in series to one of the programmed or unprogrammed first eFuses eF_R_11, ..., and eF_R_1n. A voltage determined by one of the first reference resistance element R1-1 and the first eFuses eF_R_11, ..., and eF_R_1n may be applied to the first input terminal SA of the sense amplifier 221. For example, the voltage applied to the first input terminal SA may vary depending on whether the first eFuse selected by the read word RWL line is programmed to have a programmed resistance value (programmed R) or is not programmed and thus has a resistance value in the initial state (initial R).

According to the embodiment, in order to generate a reference voltage Vref, which is applied to the second input terminal SAB of the first stage S/A 223 of the sense amplifier 221, the second reference PMOS transistor P2-1, the second reference resistance element R2-1, the second reference NMOS transistor N2-1, the third reference resistance element R3-1, and the fourth NMOS transistor N3-1 may be sequentially connected in series between the power supply voltage VDD and the first reference voltage (Voltage Reference, e.g., 0 V). In addition, the reference line RL connected to the second input terminal SAB of the first stage S/A 223 of the sense amplifier 221 may be connected between the second reference resistance element R2-1 and the second reference NMOS transistor N2-1.

The gate of the second reference PMOS transistor P2-1 may be connected to the RD signal line, and the gates of the second reference NMOS transistor N2-1 and the third reference NMOS transistor N3-1 may be connected to the RDN signal line.

When the read mode is performed, a low-level signal may be provided to the RD signal line and a high-level signal may be provided to the RDN signal line. Then, the low-level RD signal is provided to the gate of the second reference PMOS transistor P2-1, and the high-level RDN signal is provided to the gates of the second reference NMOS transistor N2-1 and the third reference NMOS transistor N3-1, such that the second reference PMOS transistor P2-1, the second reference NMOS transistor N2-1, and the third reference NMOS transistor N3-1 are all turned on (ON). Then, the reference voltage Vref applied to the second input terminal SAB may be a half of a sum of the power supply voltage VDD and the first reference voltage (Voltage Reference). According to the embodiment, the first reference voltage provided from a reference voltage generator (not illustrated) may be 0 V. Accordingly, the voltage applied to the second input terminal SAB may have a voltage value (half VDD) corresponding to a half of the power supply voltage, by the power supply voltage VDD and the first reference voltage of 0 V. Hereinafter, the voltage applied to the second input terminal SAB, that is, the voltage value (half VDD) corresponding to a half of the power supply voltage may be referred to as the reference voltage, Vref.

According to the embodiment, the reference resistance values of the first reference resistance element R1-1, the second reference resistance element R2-1, and the third reference resistance element R3-1 may all be the same. According to the embodiment, the reference resistance value (reference R) of each of the first reference resistance element R1-1, the second reference resistance element R2-1, and the third reference resistance element R3-1 may be an average value (reference R=(programmed R+initial R)/2) of the programmed resistance value (programmed R) of the eFuse and the resistance value (initial R) of the eFuse in the initial state.

According to the embodiment, the reference voltage Vref input to the second input terminal SAB of the first stage S/A 223 may have a voltage value (half VDD) corresponding to a half of the power supply voltage, and the voltage input to the first input terminal SA of the first stage S/A 223 may be higher or lower than the voltage value (half VDD) corresponding to the half of the power supply voltage, depending on whether the eFuse is programmed or not.

According to various embodiments, the sense amplifier 221 may include, as illustrated in FIG. 4, the first stage S/A 223 and the second stage S/A 225.

According to the embodiment, the first stage S/A 223 may be configured to include five PMOS transistors PM1_1, PM2_1, PM3_1, PM4_1, and PM5_1 and three NMOS transistors NM1_1, NM2_1, and NM3_1. In the first stage S/A 223, a connection structure of the PMOS transistors PM1_1, PM2_1, PM3_1, PM4_1, and PM5_1 and the NMOS transistors NM1_1, NM2_1, and NM3_1 will be described as follows.

A gate of the first PMOS transistor PM1_1 of the first stage S/A 223 may be connected to the SAENB signal line, and both ends of the first PMOS transistor PM1_1 may be connected to the power supply voltage VDD and a node between a fifth transistor PM5_1 and the fourth PMOS transistor PM4_1 of the first stage S/A 223.

A gate of the second PMOS transistor PM2_1 of the first stage S/A 223 may be connected to the RDN signal line, and both ends of the second PMOS transistor PM2_1 may be connected to the first input terminal SA and the power supply voltage VDD. According to the embodiment, the low-level RDN signal is provided through the gate of the second PMOS transistor PM2_1 while not in the read mode. The second PMOS transistor PM2_1 of the first stage S/A 223 may provide the power supply voltage VDD to the first input terminal SA. Accordingly, the first input terminal SA of the first stage S/A 223 may be precharged by the power supply voltage VDD while not in the read mode.

A gate of the third PMOS transistor PM3_1 of the first stage S/A 223 may be connected to the RDN signal line, and both ends of the third PMOS transistor PM3_1 may be connected to the second input terminal SAB and the power supply voltage VDD. According to the embodiment, the low-level RDN signal is provided through the gate while not in the read mode. The third PMOS transistor PM3_1 of the first stage S/A 223 may provide the power supply voltage VDD to the second input terminal SAB. Accordingly, the second input terminal SAB of the first stage S/A 223 may be precharged by the power supply voltage VDD while not in the read mode.

The second PMOS transistor PM2_1 and the third PMOS transistor PM3-1 are for precharging for maintaining the SA/SAB levels high before the read operation is performed. Thus, second PMOS transistor PM2_1 and the third PMOS transistor PM3-1 are turned off during the pre-sensing. That is, since the read operation is performed when RDN="H", the second PMOS transistor PM2_1 and the third PMOS transistor PM3-1 are turned off by RDN=H.

A gate of the fourth PMOS transistor PM4_1 of the first stage S/A 223 may be connected to the second input terminal SAB, and both ends of fourth PMOS transistor PM4_1 may be connected to the fifth PMOS transistor PM5_1 of the first stage S/A 223 and the third NMOS transistor NM3_1 of the first stage S/A 223. The first input terminal SA may be connected to a first node n1 between the fourth PMOS transistor PM4_1 of the first stage S/A 223 and the third NMOS transistor NM3_1 of the first stage S/A 223.

A gate of the fifth PMOS transistor PM5_1 of the first stage S/A 223 may be connected to the first input terminal SA, and both ends of the fifth PMOS transistor PM5_1 may be connected to the fourth PMOS transistor PM4_1 of the first stage S/A 223 and the second NMOS transistor NM2_1 of the first stage S/A 223. The second input terminal SAB may be connected to a second node n2 between the fifth PMOS transistor PM5_1 of the first stage S/A 223 and the second NMOS transistor NM2_1 of the first stage S/A 223.

A gate of the first NMOS transistor NM1_1 of the first stage S/A 223 may be connected to the SAEN signal line, and both ends of the first NMOS transistor NM1_1 may be connected to the ground voltage VSS and a node between the third NMOS transistor NM3_1 and the second NMOS transistor NM2_1 of the first stage S/A 223.

A gate of the second NMOS transistor NM2_1 of the first stage S/A 223 may be connected to the first input terminal SA, and both ends of the second NMOS transistor NM2_1 may be connected to the fifth PMOS transistor PM5_1 of the first stage S/A 223 and the third NMOS transistor NM3_1 of the first stage S/A 223.

A gate of the third NMOS transistor NM3_1 of the first stage S/A 223 may be connected to the second input terminal SAB, and both ends of the third NMOS transistor NM3_1 may be connected to the fourth PMOS transistor PM4_1 of the first stage S/A 223 and a node between the first NMOS transistor NM1_1 and the second NMOS transistor NM2_1 of the first stage S/A 223.

The first stage S/A 223 may include a first positive feedback circuit 420 by being configured as described above. For example, the fourth PMOS transistor PM4_1, the fifth PMOS transistor PM5_1, the second NMOS transistor NM2_1, and the third NMOS transistor NM3_1 may operate as the first positive feedback circuit 420, which amplifies the difference in input voltage.

The first positive feedback circuit 420 may operate when the low-level SAENB signal is applied to the gate of the first PMOS transistor PM1_1 of the first stage S/A 223. Since the first stage S/A 223 includes the first positive feedback circuit 420, the higher one of the two voltages may be amplified higher and the lower one of the two voltages may be amplified lower. For example, when the voltage of the first input terminal SA is higher than the reference voltage Vref, the positive feedback circuit 420 of the first stage S/A 223 may amplify the voltage of the first input terminal higher and output the same, whereas may amplify the voltage of the second input terminal SAB lower and output the same. For another example, when the voltage of the first input terminal SA is lower than the reference voltage Vref, the positive feedback circuit 420 of the first stage S/A 223 may amplify the voltage of the first input terminal lower and output the same, whereas may amplify the voltage of the second input terminal SAB higher and output the same.

The voltages amplified through the first positive feedback circuit 420 of the first stage S/A 223 may be provided to the input terminal of the second stage S/A 225. For example, in the first stage S/A 223, the first input terminal SA and the second input terminal SAB may be input to the PMOS transistors PM2_2 and PM3_2 in the second stage S/A 225.

According to the embodiment, the second stage S/A 225 may be configured to include five PMOS transistors PM1_2, PM2_2, PM3_2, PM4_2, and PM5_2 and four NMOS transistors NM1_2, NM2_2, NM3_2, and NM4_2. In the second S/A 225, a connection structure of the PMOS transistors PM1_2, PM2_2, PM3_2, PM4_2, and PM5_2 and the NMOS transistors NM1_2, NM2_2, NM3_2, and NM4_2 will be described as follows.

A gate of the first PMOS transistor PM1_2 of the second stage S/A 225 may be connected to an SAENDB signal line, and both ends of the first PMOS transistor PM1_2 may be connected to the power supply voltage VDD and a third node n3 between the second PMOS transistor PM2_2 of the second stage S/A 225 and the third PMOS transistor PM3_2 of the second stage S/A 225.

A gate of the second PMOS transistor PM2_2 of the second stage S/A 225 may be connected to the first input terminal SA that is both the input terminal and the output terminal of the first stage S/A 223. Both ends of the second PMOS transistor PM2_2 may be connected to the fourth PMOS transistor PM4_2 and the third node n3 between the second PMOS transistor PM2_2 and the third PMOS transistor PM3_2.

A gate of the third PMOS transistor PM3_2 of the second stage S/A 225 may be connected to the second input terminal SAB that is both the input terminal and the output terminal of the first stage S/A 223. Both ends of the third PMOS transistor PM3_2 may be connected to the fifth PMOS transistor PM5_2 of the second stage S/A 225 and the third node n3 between the second PMOS transistor PM2_2 and the third PMOS transistor PM3_2.

A gate of the fourth PMOS transistor PM4_2 of the second stage S/A 225 may be connected to a first output terminal SAO of the second stage S/A 225, and both ends of the fourth PMOS transistor PM4_2 may be connected to the second PMOS transistor PM2_2 of the second stage S/A 225 and the third NMOS transistor NM3_2 of the second stage S/A 225. A first output terminal SAO of the second stage S/A 225 may be connected to a fourth node n4 between the gate of the fourth PMOS transistor PM4_2 of the second stage S/A 225 and a gate of the third NMOS transistor NM3_2 of the second stage S/A 225.

A gate of the fifth PMOS transistor PM5_2 of the second stage S/A 225 may be connected to the second output terminal SAOB, and both ends of the fifth PMOS transistor PM5_2 may be connected to the third PMOS transistor PM3_2 of the second stage S/A 225 and the fourth NMOS transistor NM4_2 of the second stage S/A 225. The first output terminal SAO may be connected to a fifth node n5 between the fifth PMOS transistor PM5_2 of the second stage S/A 225 and the fourth NMOS transistor NM4_2 of the second stage S/A 225.

A gate of the first NMOS transistor NM1_2 of the second stage S/A 225 may be connected to the SAENDB signal line, and both ends of the first NMOS transistor NM1_2 may be connected to the ground voltage VSS and the second output terminal SAOB of the second stage S/A 225.

A gate of the second NMOS transistor NM2_2 of the second stage S/A 225 may be connected to the SAENDB signal line, and both ends of the second NMOS transistor NM2_2 may be connected to the ground voltage VSS and the first output terminal SAO of the second stage S/A 225.

The gate of the third NMOS transistor NM3_2 of the second stage S/A 225 may be connected to the first output terminal SAO, and both ends of the third NMOS transistor NM3_2 may be connected to the ground voltage VSS and the fourth PMOS transistor PM4_2 of the second stage S/A 225. The second output terminal SAOB may be connected to a sixth node n6 between the third NMOS transistor NM3_2 of the second stage S/A 225 and the fourth PMOS transistor PM4_2 of the second stage S/A 225.

A gate of the fourth NMOS transistor NM4_2 of the second stage S/A 225 may be connected to the second output terminal SAOB, and both ends of the fourth NMOS transistor NM4_2 may be connected to the ground voltage VSS and the fifth PMOS transistor PM5_2 of the second stage S/A 225. The second output terminal SAOB may be connected to a seventh node n7 between the gate of the fourth NMOS transistor NM4_2 of the second stage S/A 225 and the gate of the fifth PMOS transistor PM5_2 of the second stage S/A 225.

The second stage S/A 225 is configured as described above, such that the voltages amplified by the first positive feedback circuit 420 of the first stage S/A 223 may be applied to the second stage S/A 225, and the second stage S/A 225 may amplify the voltages once again and output the same. The second stage S/A 225 may include a second positive feedback circuit 460. For example, in the second stage S/A 225, the fourth PMOS transistor PM4_2, the fifth PMOS transistor PM5_2, the third NMOS transistor NM3_2, and the fourth NMOS transistor NM4_2 may operate as the second positive feedback circuit 460 which amplifies the difference in input voltage. When the low-level SAENDB signal is applied to the first PMOS transistor PM1_2 of the second stage S/A 225, the second positive feedback circuit 460 may operate according to the levels of the second and third PMOS transistors PM2_2 and PM3_2. When the preliminary amplification in the first stage S/A 223 is completed, the SAENB signal may change from a low level to a high level, and the SAENDB signal may change from a high level to a low level.

Since the second stage S/A 225 includes the second positive feedback circuit 460, a higher voltage among the input voltages may be amplified higher and a lower voltage among the input voltages may be amplified lower. According to the embodiment, the output of the first stage S/A 223 is received by the PMOS transistors PM2_2 and PM3_2 in the second stage S/A 225. This is because, since there is a small difference in the voltage level amplified in the first stage S/A, the amplified voltage is intended to be sensed and amplified even at an extremely low voltage. For example, assuming that the VDD is about 1.5 V, the voltages SA/SAB amplified in the first stage S/A 223 may be very small of about 0.75±α. Accordingly, in the second stage S/A 225 according to various embodiments of the present disclosure, the amplified voltage SA/SAB of the first stage S/A 223 is received by the PMOS transistors PM4_2 and PM5_2, such that it is possible to sense the amplified voltage even at the extremely low voltage, and the input terminal and the final output terminals SAO and SAOB of the sense amplifier 221 can be separated. In various embodiments of the present disclosure, the final output terminals SAO and SAOB of the sense amplifier 221 are separated from the input terminals SA and SAB, such that the final output terminals SAO and SAOB are not affected by the DC current path, and thus, the amplification to a full logic level is possible.

In addition, since the sense amplifier 221 according to various embodiments of the present disclosure performs two-stage amplification including the preliminary amplification and regeneration amplification, a separate waiting time for increasing the difference in input voltage is not required, and thus, high-speed operations are possible.

Figure 5:
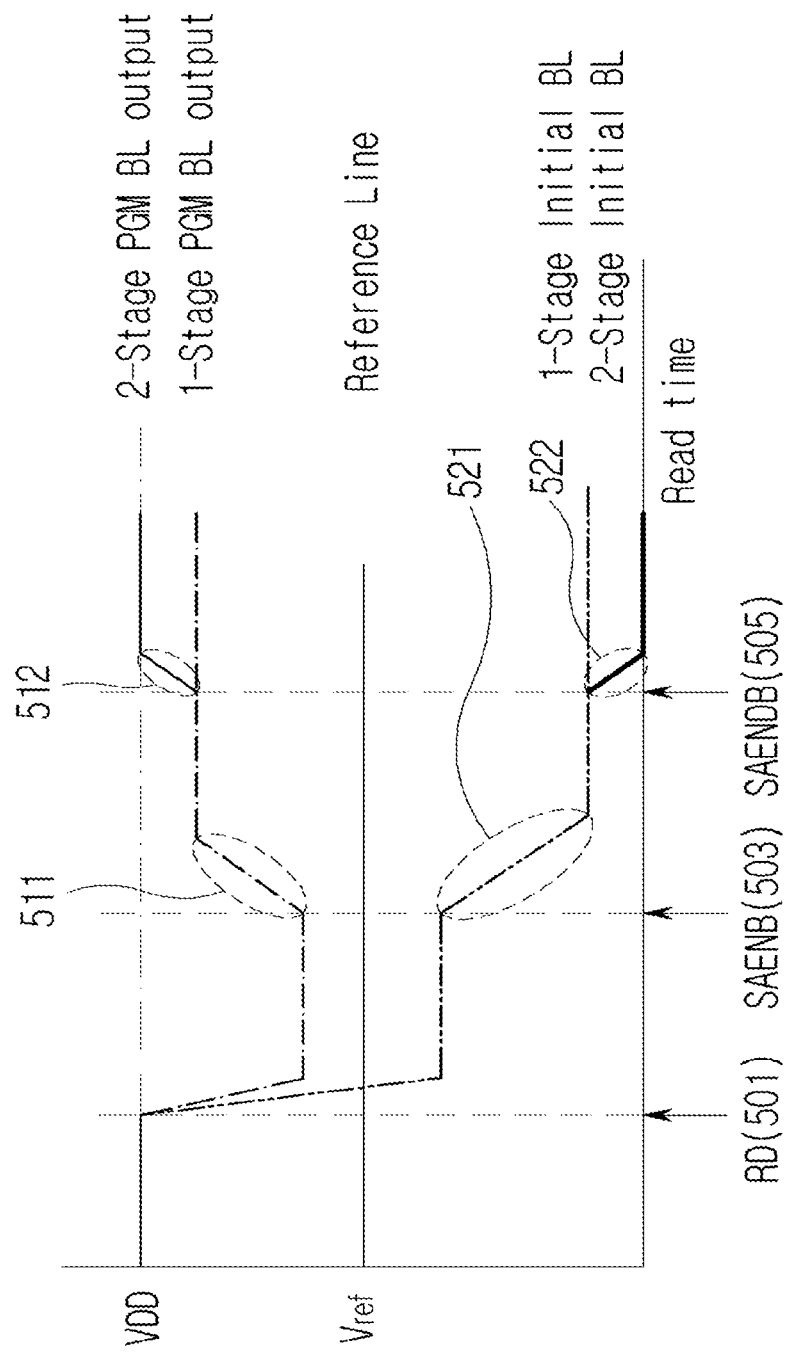
FIG. 5 illustrates a read operation of the sense amplifier according to various embodiments of the present disclosure.

FIG. 5 illustrates a read result of the sense amplifier according to various embodiments of the present disclosure. Here, a case will be described as an example, where the first memory cell 301-1 among the memory cells 301-1, . . . , and 301-n connected to the first bit line is programmed and the n-th memory cell 301-n maintains the initial state.

First, a case where the sense amplifier 221 reads data of the programmed first memory cell 301-1 will be described as an example.

Referring to FIG. 5, after a low-level RD signal 501 for the read operation is generated, the sense amplifier 221 may sense the voltage of the first bit line and the reference voltage Vref through the first input terminal SA and the second input terminal SAB of the first stage S/A 223. Here, since the first memory cell 301-1 has been programmed, the voltage of the first input terminal SA may be higher than the reference voltage Vref and less than the VDD. When a low-level SAENB signal 503 is input to the sense amplifier 221, the sense amplifier 221 may perform the preliminary amplification, which amplify (see reference numeral 511), through the first stage S/A 223, a difference between the reference voltage Vref and the voltage generated by the programmed resistance of the first memory cell 301-1. When a low-level SAENDB signal 505 is input to the sense amplifier 221, the sense amplifier 221 may perform the regeneration amplification, which additionally amplifies (see reference numeral 512), through the second stage S/A 225, the result of the preliminary amplification of the first stage S/A 233, thereby amplifying the result of the regeneration amplification to a full logic level. Accordingly, the sense amplifier 221 may output the programmed data in the first memory cell 301-1.

Next, a case where the sense amplifier 221 reads data of the n-th memory cell 101-n, which maintains the initial state, will be described as an example.

Referring to FIG. 5, after the low-level RD signal 501 for the read operation is generated, the sense amplifier 221 may sense the voltage of the first bit line and the reference voltage Vref through the first input terminal SA and the second input terminal SAB of the first stage S/A 223. Here, since the n-th memory cell 301-n is in the initial state, the voltage of the first input terminal SA may be less than the reference voltage Vref and greater than 0. When the SAENB signal 503 input to the sense amplifier 221 is at a low level, the sense amplifier 221 may perform the preliminary amplification, which amplify (see reference numeral 521), through the first stage S/A 223, a difference between the reference voltage and the voltage generated by the resistance of the n-th memory cell 301-n in the initial state. When the low-level SAENDB signal 505 is input to the sense amplifier 221, the sense amplifier 221 may perform the regeneration amplification, which additionally amplifies (see reference numeral 522), through the second stage S/A 225, the result of the preliminary amplification of the first stage S/A 233, thereby amplifying the result of the regeneration amplification to a full logic level. Accordingly, the sense amplifier 221 may output the data of the n-th memory cell 301-n in the initial state.

As described above, the non-volatile memory device 200 according to various embodiments of the present disclosure includes the sense amplifier 221 having the two-stage sensing structure, in which the input terminal and the final output terminal are separated. Therefore, as illustrated in Table 1 below, the data of the memory cell can be successfully read and output even at a low voltage LVDD, where the VDD value is equal to or lower than 2.0 V.

TABLE 1

| LVDD | Typical (TT, 25 C.) | Worst (SS, −40 C.) |
| --- | --- | --- |
| Sense Amplifier 141-1 | 1.02 V | 1.30 V |
| Sense Amplifier 221 | 0.86 V | 1.06 V |

As illustrated in Table 1 above, in the case where the sense amplifier 141-1 of FIG. 1B is used, only when a power supply voltage of at least 1.30 V is supplied under the worst environmental conditions, the data of the memory cell can be successfully read and output. However, in the case where the sense amplifier 221 described with reference to FIGS. 2 to 4 is used, even when a power supply voltage of 1.06 V is supplied under the worst environmental conditions, the data of the memory cell can be successfully read and output. That is, when the sense amplifier 221 according to various embodiments of the present disclosure is used, the data of the memory cell can be successfully read and output even at a very low voltage.

Figure 6A:
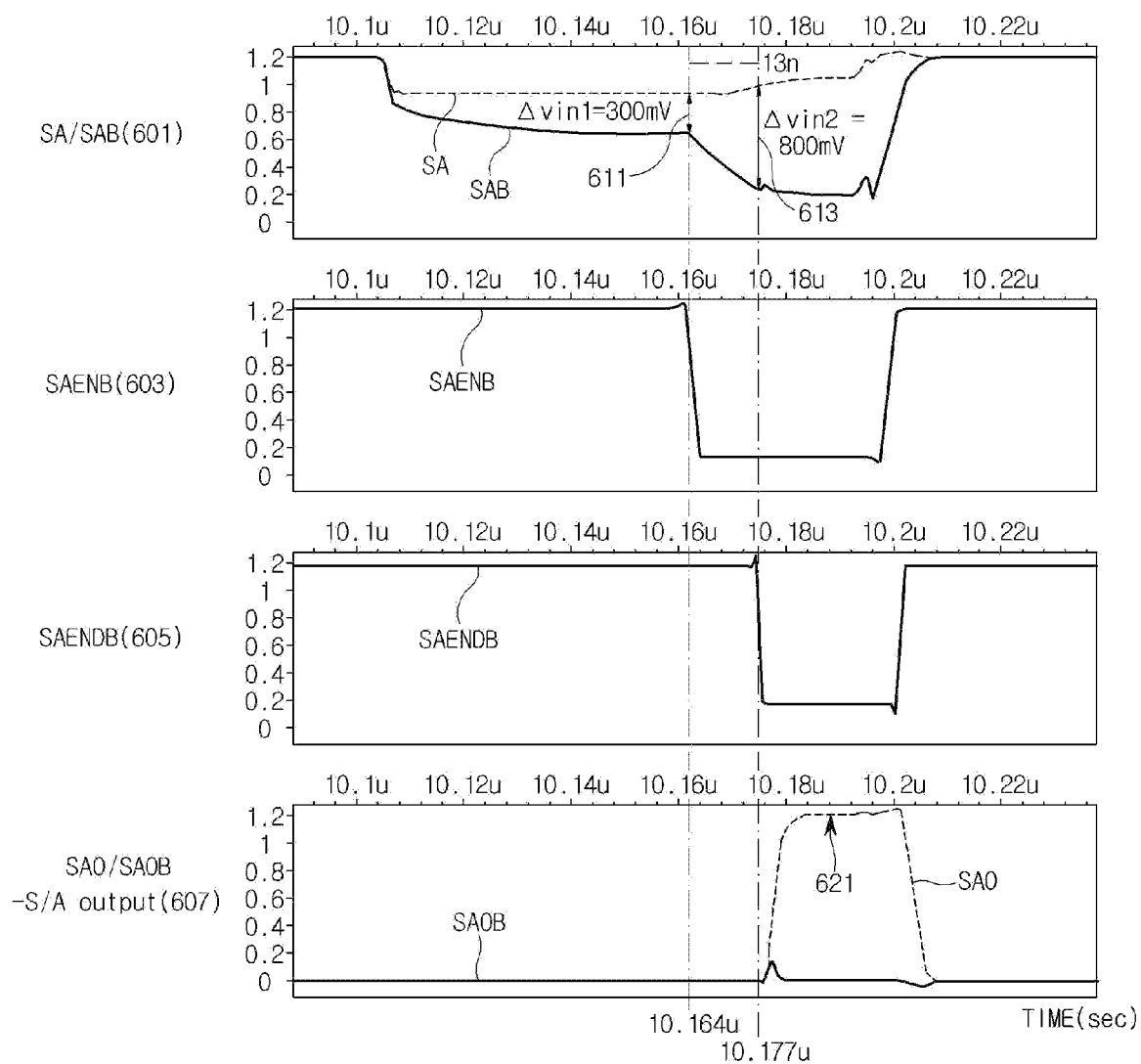
FIGS. 6A and 6B illustrate simulation results of a read operation performed at a low voltage by the sense amplifier according to various embodiments of the present disclosure.
Figure 6B:
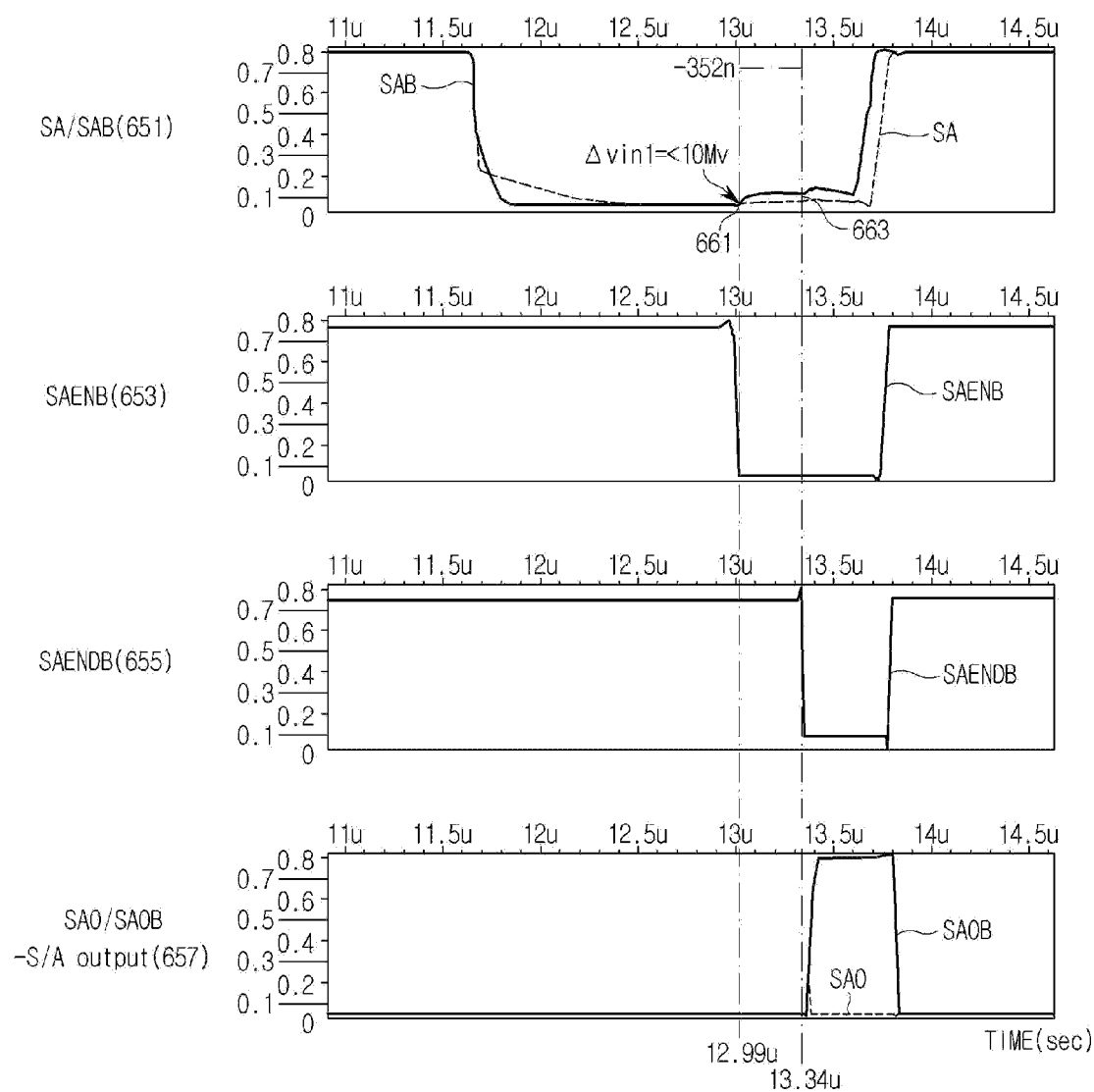

FIGS. 6A and 6B illustrate simulation results of the read operation performed at a low voltage by the sense amplifier 221 according to various embodiments of the present disclosure.

FIG. 6A illustrates a case, where data of a specific memory cell is read by the sense amplifier 221 when the power supply voltage is 1.2 V, and FIG. 6B illustrates a case, where the data of a specific memory cell is read by the sense amplifier 221 when the power supply voltage is 0.8 V. The simulation environment of FIG. 6A is the same as the simulation environment of FIG. 6B.

Referring to FIG. 6A, a low-level SAENB signal 603 is input. Through the first stage S/A 223, the sense amplifier 221 may sense a difference ΔVin1 in input voltages SA/SAB 601, and may perform a preliminary amplification 611 of the sensed voltage difference. As a result of performing the preliminary amplification 611, a difference ΔVin2 between the SA and the SAB may be from 300 mV (ΔVin1) to 800 mV (ΔVin2). Then, when a low-level SAENDB signal 605 is input, the sense amplifier 221 may sense, through the second stage S/A 225, the difference ΔVin2 in the voltages SA/SAB preliminarily amplified in the first stage S/A 223 and may perform the regeneration amplification 613, which performs the difference ΔVin2 in the SA/SAB once more. As a result of performing the regeneration amplification 613, voltages SAO/SAOB 607 output in the second stage S/A 225 may be amplified to full H/L logic levels 621, respectively. Since the SA/SAB is pre-sensed in the first stage, the operation time of the second stage S/A 225 may be shorter than the operation time of the first stage S/A 223. Due to this, a high-speed read operation is possible.

Referring to FIG. 6B, a low-level SAENB signal 653 is input. Through the first stage S/A 223, the sense amplifier 221 may sense a difference ΔVin1 in input voltage SA/SAB 651, and may perform a preliminary amplification 661 of the sensed voltage difference Vin1. However, because the difference ΔVin1 in the input voltage SA/SAB 651 is very small due to the very low voltage, the preliminary amplification 661 fails. This may lead to the failure of the regeneration amplification 663 of the second stage S/A 225. Finally, voltages SAO/SAOB 657 output in the second stage S/A 225 are L/H, respectively. This may be opposite to the result of FIG. 6A.

According to various embodiments of the present disclosure through the simulations illustrated in FIGS. 6A and 6B, it can be confirmed that the sense amplifier does not operate normally at a very low voltage of 0.8 V, but can operate normally at a low voltage of 1.2 V.

Figure 7:
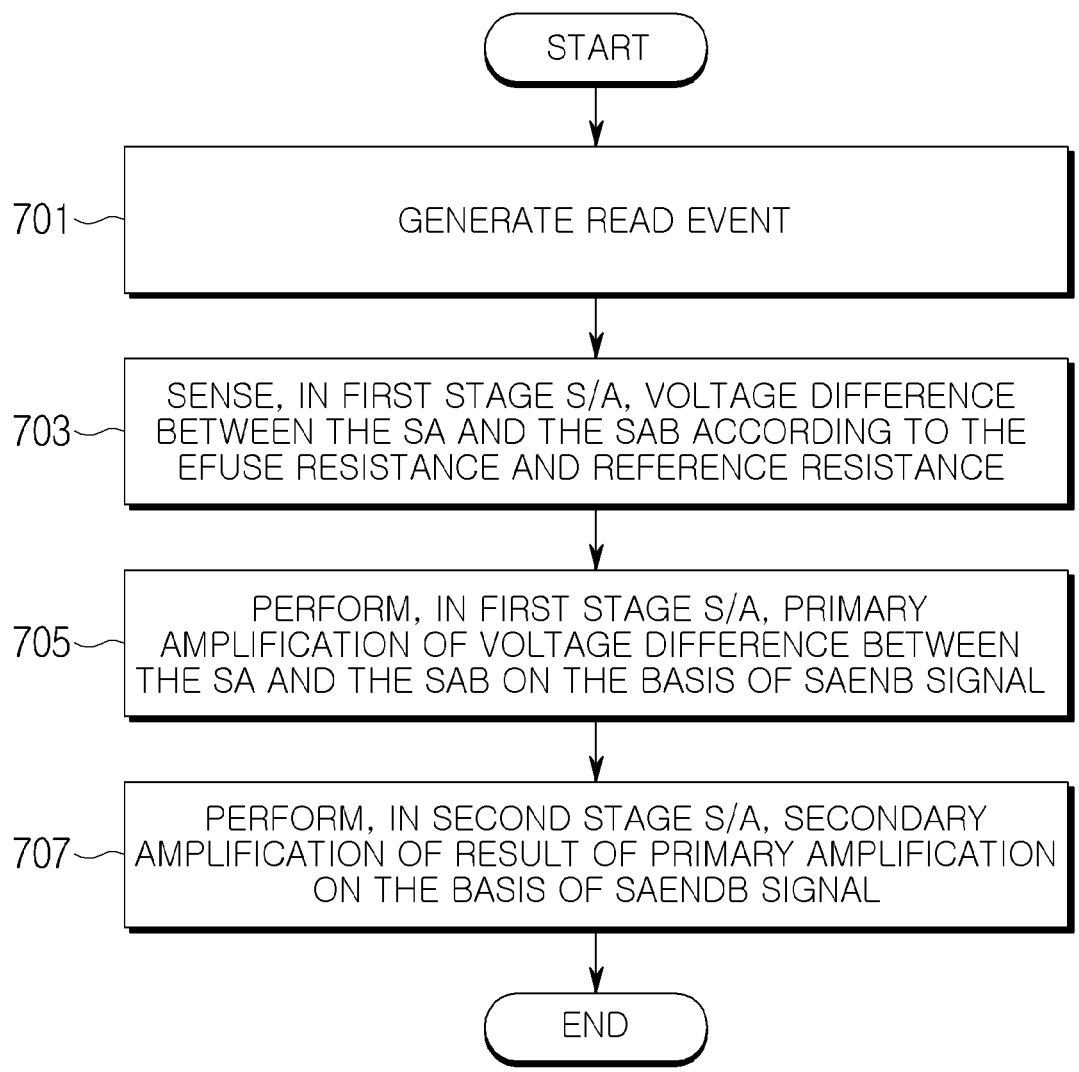
FIG. 7 illustrates a flowchart when the read operation of the sense amplifier is performed according to various embodiments of the present disclosure.

FIG. 7 is a flowchart illustrating that the read operation of the sense amplifier is performed according to various embodiments of the present disclosure. In the following embodiment, respective steps may be sequentially performed, or may not be necessarily performed sequentially. For example, the order of the respective steps may be changed, and at least two steps may be performed in parallel.

Referring to FIG. 7, in step 701, the sense amplifier 221 may sense the occurrence of a read event. The occurrence of the read event may be sensed based on the low-level RD signal indicating the read mode for a read operation.

In step 703, in the first stage S/A 223 of the sense amplifier 221, the voltage difference between the SA and the SAB according to the eFuse resistance and the resistance of a reference node may be sensed. For example, in the first stage S/A 223 of the sense amplifier 221, the difference between the voltage applied to the first input terminal SA through the connected bit line and the reference voltage applied to the second input terminal SAB through the connected reference line RL may be sensed. The voltage applied to the first input terminal SA through the bit line may be determined by whether the eFuse resistance of the memory cell connected to the corresponding bit line is in a programmed state. The reference voltage applied to the second input terminal SAB through the reference line RL may be determined by a reference resistance connected to the reference line RL. The reference resistance may be an average value (reference R=(programmed R+initial R)/2) of the programmed resistance (programmed R) of the eFuse and the unprogrammed resistance (initial R) of the eFuse in the initial state.

In step 705, in the first stage S/A 223 of the sense amplifier 221, based on the SAENB signal, a primary amplification (or preliminary amplification) of the voltage difference between the SA and the SAB may be performed. The SAENB signal may be a signal obtained by inverting the SAEN signal that is an enabling signal for the sense amplifier. For example, in the first stage S/A 223 of the sense amplifier 221, when the low-level SAENB signal is input, the voltage difference between the SA and the SAB may be amplified through the first positive feedback circuit 420.

In step 707, in the second stage S/A 225 of the sense amplifier 221, based on the SAENDB signal, a secondary amplification (regeneration amplification) of the result of the primary amplification may be performed. The SAENDB signal may have the same phase as that of the SAENB signal and may be a delayed signal. For example, in the second stage S/A 225 of the sense amplifier 221, when the low-level SAENDB signal is input, a difference in output voltage of the first stage S/A may be sensed. In the second stage S/A 225 of the sense amplifier 221, the secondary amplification of the difference in output voltage of the first stage S/A may be performed through the second positive feedback circuit 460. Accordingly, the voltage input to the first input terminal SA of the sense amplifier 221 may be amplified to a full logic level and then output.

According to various embodiments of the present disclosure, the sense amplifier of the non-volatile memory device performs a two-stage amplification operation, thereby performing a high-speed read operation even at a low voltage. In addition, according to various embodiments of the present disclosure, the input terminal and the final output terminal of the sense amplifier are separated by the two-stage sensing structure, so that the final output terminal is not affected by a DC current path, and accordingly, the read operation can be performed even at an operating voltage lower than 2 V.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure

What is claimed is:

1. A non-volatile memory device, comprising:
   a memory cell array comprising a plurality of memory cells; and
   a sense amplifier configured to read data of the plurality of memory cells and output the read data,
   wherein the sense amplifier comprises:
      a first stage sense amplifier configured to sense a voltage difference between a reference voltage and a voltage of a bit line connected to at least one memory cell among the plurality of memory cells, and perform a primary amplification of the sensed voltage difference; and
      a second stage sense amplifier configured to perform a secondary amplification of a first result of the primary amplification and output a second result of the secondary amplification,
   wherein the first stage sense amplifier comprises a first positive feedback circuit connected to a first input terminal to which the voltage of the bit line is applied and a second input terminal to which the reference voltage is applied,
   wherein the second stage sense amplifier comprises a second positive feedback circuit connected to a first output terminal and a second output terminal, which output the second result of the secondary amplification, and
   wherein a first input terminal of the second stage sense amplifier and a second input terminal of the second stage sense amplifier are connected to the first input terminal of the first stage sense amplifier and the second input terminal of the first stage sense amplifier, respectively,
   wherein the first input terminal is connected to the bit line connected to at least one memory cell among the plurality of memory cells, and
   wherein a first reference resistance element and a first reference PMOS transistor are connected to the bit line between the at least one memory cell and the first input terminal.

2. The non-volatile memory device of claim 1, wherein the first positive feedback circuit is driven based on a first signal that is an inverted signal of a second signal for enabling the sense amplifier.

3. The non-volatile memory device of claim 2, wherein the first stage sense amplifier further comprises a first PMOS transistor of the first stage sense amplifier, of which both ends are connected to the first positive feedback circuit and a power supply voltage, and
   wherein the first positive feedback circuit is driven when the first signal input to a gate of the first PMOS transistor of the first stage sense amplifier is at a low level.

4. The non-volatile memory device of claim 3, wherein the first stage sense amplifier further comprises:
   a second PMOS transistor of the first stage sense amplifier, of which both ends are connected to the first input terminal and the power supply voltage; and
   a third PMOS transistor of the first stage sense amplifier, of which both ends are connected to the second input terminal and the power supply voltage,
   wherein the first input terminal and the second input terminal are charged by the power supply voltage while a read mode inversion signal with a low level supplies to a gate of the second PMOS transistor of the first stage sense amplifier and a gate of the third PMOS transistor of the first stage sense amplifier, and
   wherein the read mode inversion signal with the low level indicates that a mode of the non-volatile memory device is not in a read mode.

5. The non-volatile memory device of claim 4, wherein the first stage sense amplifier further comprises a first NMOS transistor of the first stage sense amplifier, of which both ends are connected to the first positive feedback circuit and the ground voltage, and
   wherein, when the second signal with a high level supplies to a gate of the first NMOS transistor of the first stage sense amplifier, the first positive feedback circuit is connected to the ground voltage.

6. The non-volatile memory device of claim 5, wherein the first positive feedback circuit comprises a fourth PMOS transistor of the first positive feedback circuit, a fifth PMOS transistor of the first positive feedback circuit, a second NMOS transistor of the first positive feedback circuit, and a third NMOS transistor of the first positive feedback circuit.

7. The non-volatile memory device of claim 3, wherein the second positive feedback circuit is configured to perform the secondary amplification based on the first result of the primary amplification, and
   wherein the second positive feedback circuit is driven based on a third signal that is a delayed signal of the first signal.

8. The non-volatile memory device of claim 7, wherein the second stage sense amplifier further comprises a first PMOS transistor of the second stage sense amplifier, of which both ends are connected to the second positive feedback circuit and the power supply voltage, and
   wherein the second positive feedback circuit is driven when the third signal input to a gate of the first PMOS transistor of the second stage sense amplifier is at a low level.

9. The non-volatile memory device of claim 8, wherein the second stage sense amplifier further comprises a third PMOS transistor of the second stage sense amplifier and a second PMOS transistor of the second stage sense amplifier, which connects between the first PMOS transistor of the second stage sense amplifier and the second positive feedback circuit,
   wherein a gate of the second PMOS transistor of the second stage sense amplifier is connected to the first input terminal of the first stage sense amplifier, and wherein a gate of the third PMOS transistor of the second stage sense amplifier is connected to the second input terminal of the first stage sense amplifier.

10. The non-volatile memory device of claim 9, wherein the second positive feedback circuit further comprises:
a first NMOS transistor of the second positive feedback circuit, of which both ends are connected to the second output terminal and the ground voltage; and
a second NMOS transistor of the second positive feedback circuit, of which both ends are connected to the first output terminal and the ground voltage, and
wherein, when the third signal with a high level supplies to gates of the first NMOS transistor of the second positive feedback circuit and the second NMOS transistor of the second positive feedback circuit, the second positive feedback circuit is connected to the ground voltage.

11. The non-volatile memory device of claim 10, wherein the second positive feedback circuit comprises a fourth PMOS transistor of the second positive feedback circuit, a fifth PMOS transistor of the second positive feedback circuit, a third NMOS transistor of the second positive feedback circuit, and a fourth NMOS transistor of the second positive feedback circuit.

12. The non-volatile memory device of claim 1, further comprising, in order to generate the reference voltage, a second reference PMOS transistor, a second reference resistance element, a second reference NMOS transistor, a third reference resistance element, and a third reference NMOS transistor, which are sequentially connected in series between a power supply voltage and a first reference voltage,
wherein the second input terminal is supplied with the reference voltage through a reference line, which is connected between the second reference resistance element and the second reference NMOS transistor.

13. The non-volatile memory device of claim 1, wherein the first output terminal and the second output terminal are separated from the first input terminal and the second input terminal.

14. The non-volatile memory device of claim 1, wherein the first positive feedback circuit and the second positive feedback circuit have the same configuration.

15. A non-volatile memory device, comprising:
a memory cell array comprising a plurality of memory cells; and
a sense amplifier configured to read data of the plurality of memory cells and output the read data,
wherein the sense amplifier comprises:
a first stage sense amplifier configured to sense a voltage difference between a reference voltage and a voltage of a bit line connected to at least one memory cell among the plurality of memory cells, and perform a primary amplification of the sensed voltage difference; and
a second stage sense amplifier configured to perform a secondary amplification of a first result of the primary amplification and output a second result of the secondary amplification,
wherein the first stage sense amplifier comprises a first positive feedback circuit connected to a first input terminal to which the voltage of the bit line is applied and a second input terminal to which the reference voltage is applied,
wherein the second stage sense amplifier comprises a second positive feedback circuit connected to a first output terminal and a second output terminal, which output the second result of the secondary amplification, and
wherein a first input terminal of the second stage sense amplifier and a second input terminal of the second stage sense amplifier are directly connected to the first input terminal of the first stage sense amplifier and the second input terminal of the first stage sense amplifier, respectively.

16. The non-volatile memory device of claim 15, wherein the first positive feedback circuit is driven based on a first signal that is an inverted signal of a second signal for enabling the sense amplifier,
wherein the second positive feedback circuit is configured to perform the secondary amplification based on the first result of the primary amplification, and
wherein the second positive feedback circuit is driven based on a third signal that is a delayed signal of the first signal.

17. The non-volatile memory device of claim 15, wherein the first input terminal is connected to the bit line connected to at least one memory cell among the plurality of memory cells, and
wherein a first reference resistance element and a first reference PMOS transistor are connected to the bit line between the at least one memory cell and the first input terminal.

18. The non-volatile memory device of claim 15, wherein the first output terminal and the second output terminal are separated from the first input terminal and the second input terminal.

19. The non-volatile memory device of claim 15, wherein the first positive feedback circuit and the second positive feedback circuit have the same configuration.

* * * * *